United States Patent
Greco et al.

(10) Patent No.: US 8,299,537 B2
(45) Date of Patent: Oct. 30, 2012

(54) SEMICONDUCTOR-ON-INSULATOR SUBSTRATE AND STRUCTURE INCLUDING MULTIPLE ORDER RADIO FREQUENCY HARMONIC SUPRESSING REGION

(75) Inventors: Joseph R. Greco, South Burlington, VT (US); Kevin Munger, Fairfax, VT (US); Richard A. Phelps, Colchester, VT (US); Jennifer C. Robbins, Richmond, VT (US); William Savaria, Colchester, VT (US); James A. Slinkman, Montpelier, VT (US); Randy L. Wolf, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 12/369,099

(22) Filed: Feb. 11, 2009

(65) Prior Publication Data
US 2010/0200927 A1    Aug. 12, 2010

(51) Int. Cl.
*H01L 21/70* (2006.01)

(52) U.S. Cl. .................. 257/369; 257/347; 257/E21.32; 257/E21.561; 257/E27.009

(58) Field of Classification Search ................. 257/369, 257/347, E21.32, E27.009
See application file for complete search history.

(56) References Cited

U.S. PATENT DOCUMENTS

| | | | |
|---|---|---|---|
| 5,468,657 A | 11/1995 | Hsu | |
| 5,723,896 A | 3/1998 | Yee et al. | |
| 6,998,353 B2 | 2/2006 | Erokhin et al. | |
| 7,339,235 B1 | 3/2008 | Yamazaki et al. | |
| 7,361,534 B2 | 4/2008 | Pelella | |
| 7,382,023 B2 | 6/2008 | Chen et al. | |
| 7,910,993 B2 * | 3/2011 | Brindle et al. | 257/347 |
| 2002/0011670 A1 | 1/2002 | Higashi et al. | |
| 2006/0044641 A1 * | 3/2006 | Alles et al. | 359/328 |
| 2007/0087492 A1 * | 4/2007 | Yamanaka | 438/166 |
| 2008/0048636 A1 | 2/2008 | Tsidilkovski et al. | |
| 2008/0258181 A1 | 10/2008 | Cannon et al. | |
| 2008/0266227 A1 * | 10/2008 | Arasawa et al. | 345/89 |
| 2008/0318367 A1 | 12/2008 | Shimomura et al. | |

OTHER PUBLICATIONS

International Search Report dated Mar. 16, 201.

* cited by examiner

*Primary Examiner* — Kimberly Rizkallah
*Assistant Examiner* — Timor Karimy
(74) *Attorney, Agent, or Firm* — Scully, Scott, Murphy & Presser, P.C.; Richard M. Kotulak, Esq.

(57) ABSTRACT

A semiconductor-on-insulator substrate and a related semiconductor structure, as well as a method for fabricating the semiconductor-on-insulator substrate and the related semiconductor structure, provide for a multiple order radio frequency harmonic suppressing region located and formed within a base semiconductor substrate at a location beneath an interface of a buried dielectric layer with the base semiconductor substrate within the semiconductor-on-insulator substrate. The multiple order radio frequency harmonic suppressing region may comprise an ion implanted atom, such as but not limited to a noble gas atom, to provide a suppressed multiple order radio frequency harmonic when powering a radio frequency device, such as but not limited to a radio frequency complementary metal oxide semiconductor device (or alternatively a passive device), located and formed within and upon a surface semiconductor layer within the semiconductor structure.

10 Claims, 2 Drawing Sheets

SEMICONDUCTOR-ON-INSULATOR SUBSTRATE AND STRUCTURE INCLUDING MULTIPLE ORDER RADIO FREQUENCY HARMONIC SUPRESSING REGION

BACKGROUND

1. Field of the Invention

The invention relates generally to semiconductor-on-insulator substrates, and semiconductor structures within and upon semiconductor-on-insulator substrates. More particularly, the invention relates to multiple order radio frequency harmonic suppression within radio frequency circuits comprising semiconductor structures within and upon semiconductor-on-insulator substrates.

2. Description of the Related Art

Semiconductor structures include semiconductor substrates within and upon which are formed semiconductor devices such as but not limited to resistors, transistors, diodes and capacitors. The semiconductor devices are connected and interconnected using patterned conductor layers that are separated by dielectric layers.

Within the context of semiconductor substrates that are used in the fabrication of semiconductor structures, there has more recently evolved the use of semiconductor-on-insulator substrates in comparison with the use of bulk semiconductor substrates. Semiconductor-on-insulator substrates comprise a base semiconductor substrate, a buried dielectric layer located upon the base semiconductor substrate and a surface semiconductor layer located further upon the buried dielectric layer. Thus, under circumstances where a base semiconductor substrate and a surface semiconductor layer within a semiconductor-on-insulator substrate comprise a single semiconductor material having a single crystallographic orientation, the semiconductor-on-insulator substrate may under certain circumstances be fabricated by incorporation of a buried dielectric layer within a thickness of a bulk semiconductor substrate.

Semiconductor-on-insulator substrates find many uses within semiconductor structure fabrication, and more recently semiconductor-on-insulator substrates have been proposed for fabrication of complementary metal oxide semiconductor (CMOS) structures for use within radio frequency applications. Semiconductor-on-insulator substrates are desirable within such radio frequency applications insofar as the presence of the buried dielectric layer provides for reduced capacitive coupling between a surface semiconductor layer and a base semiconductor substrate within the semiconductor-on-insulator substrate.

A performance characteristic that is desirable within radio frequency integrated circuit applications is that a multiple order radio frequency harmonic with respect to a primary transmitted radio frequency power frequency (i.e., 1fo), such as but not limited to a second order harmonic (i.e., 2fo) or a third order harmonic (i.e., 3fo), be considerably suppressed (i.e., from at least 30 to 40 decibels (dB) suppressed). Unfortunately, current configurations of semiconductor-on-insulator substrates typically do not fulfill the forgoing desirable multiple order radio frequency harmonic suppression characteristics.

Thus, desirable are semiconductor-on-insulator substrates and related semiconductor structures, and methods for fabricating the semiconductor-on-insulator substrates and related semiconductor structures, that allow for fabrication of radio frequency devices and radio frequency circuits with suppressed multiple order radio frequency harmonics.

SUMMARY

The invention provides a semiconductor-on-insulator substrate that may be used to provide a semiconductor structure having a suppressed multiple order radio frequency harmonic, and a method for fabricating the semiconductor-on-insulator substrate that may be used to provide the semiconductor structure having the suppressed multiple order radio frequency harmonic. The method for fabricating the semiconductor-on-insulator substrate provides the semiconductor-on-insulator substrate with the suppressed multiple order radio frequency harmonic by forming (i.e., typically by ion implanting) a multiple order radio frequency harmonic suppressing region within a base semiconductor substrate at a location beneath an interface of a buried dielectric layer with the base semiconductor substrate within the semiconductor-on-insulator substrate. Such a multiple order radio frequency harmonic suppressing region may be fabricated as a continuous planar region within the base semiconductor substrate, or alternatively as discontinuous planar regions within the base semiconductor substrate at locations beneath a plurality of isolation regions that separate a plurality of surface semiconductor layer islands within the semiconductor-on-insulator substrate.

A particular semiconductor-on-insulator substrate in accordance with the invention includes a base semiconductor substrate. The particular semiconductor-on-insulator substrate also includes a buried dielectric layer located upon the base semiconductor substrate. The particular semiconductor-on-insulator substrate also includes a surface semiconductor layer located upon the buried dielectric layer. The base semiconductor substrate includes at least one multiple order radio frequency harmonic suppressing region having a composition different than the buried dielectric layer.

A particular method for fabricating a semiconductor-on-insulator substrate in accordance with the invention includes forming a multiple order radio frequency harmonic suppressing region within a base semiconductor substrate within a semiconductor-on-insulator substrate that includes: (1) a base semiconductor substrate; (2) a buried dielectric layer formed upon the base semiconductor substrate; and (3) a surface semiconductor layer formed upon the buried dielectric layer. The multiple order radio frequency harmonic suppressing region has a composition different than the buried dielectric layer.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, that form a material part of this disclosure, wherein.

DESCRIPTION OF THE PREFERRED EMBODIMENTS

The invention, which includes a semiconductor-on-insulator substrate that may be used within a semiconductor structure having enhanced multiple order radio frequency harmonic suppression, and a method for fabricating the semiconductor-on-insulator substrate that may be used within the semiconductor structure having the enhanced multiple radio frequency harmonic suppression, is understood within the context of the description set forth below. The description set forth below is understood within the context of the drawings described above. Since the drawings are intended for illustrative purposes, the drawings are not necessarily drawn to scale.

Figure 1:
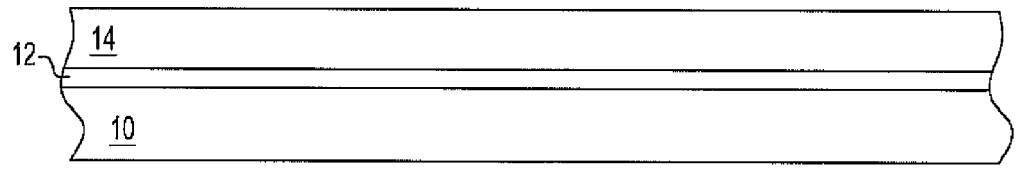
FIG. 1 to FIG. 4 show a series of schematic cross-sectional diagrams illustrating the results of progressive semiconductor-on-insulator substrate fabrication (FIG. 1), multiple order radio frequency harmonic suppressing region formation (FIG. 2), isolation region formation (FIG. 3) and field effect device fabrication (FIG. 4) process steps for fabricating a radio frequency complementary metal oxide semiconductor-on-insulator structure in accordance with a particular embodiment of the invention.

FIG. 1 to FIG. 4 show a series of schematic cross-sectional diagrams illustrating the results of progressive process steps in fabricating a semiconductor-on-insulator substrate and a complementary metal oxide semiconductor structure that provides suppressed multiple order radio frequency harmonics in accordance with a particular embodiment of the invention. This particular embodiment of the invention comprises a first particular embodiment of the invention. FIG. 1 shows a schematic cross-sectional diagram of the complementary metal oxide semiconductor structure at an early stage in the fabrication thereof in accordance with this first particular embodiment of the invention.

FIG. 1 shows a base semiconductor substrate 10. A buried dielectric layer 12 is located and formed upon the base semiconductor substrate 10. A surface semiconductor layer 14 is located and formed upon the buried dielectric layer 12. In an aggregate, the base semiconductor substrate 10, the buried dielectric layer 12 and the surface semiconductor layer 14 comprise a semiconductor-on-insulator substrate.

The base semiconductor substrate 10 may comprise any of several semiconductor materials. Non-limiting examples of such semiconductor materials include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 comprises a silicon or silicon-germanium alloy semiconductor material that has a generally conventional thickness.

The buried dielectric layer 12 may comprise any of several dielectric materials. Non-limiting examples of dielectric materials include oxides, nitrides and oxynitrides, particularly of silicon, but oxides, nitrides and oxynitrides of other elements are not excluded. The buried dielectric layer 12 may comprise a crystalline or a non-crystalline dielectric material, with crystalline dielectric materials being preferred under certain circumstances. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the base semiconductor substrate 10. Typically, the buried dielectric layer 12 has a thickness from 100 to 1000 nanometers. In addition, a generally thicker buried dielectric layer 12 (i.e., greater than 200 nanometers) is often desirable for gigahertz (GHz) wireless radio frequency (RF) applications. In general, the above buried dielectric layer 12 thickness range may provide radio frequency semiconductor-on-insulator semiconductor structures and circuits that are operative in a range from 900 MHz to 6 GHz.

The surface semiconductor layer 14 may comprise any of the several semiconductor materials from which the base semiconductor substrate 10 may be comprised. The surface semiconductor layer 14 and the base semiconductor substrate 10 may comprise identical, similar or different semiconductor materials with respect to chemical composition, dopant concentration and crystallographic orientation. Different semiconductor materials are often selected to provide different semiconductor devices that operate in different radio frequency ranges. Typically, the surface semiconductor layer 14 has a thickness from 100 to 1500 nanometers.

The semiconductor-on-insulator substrate that is illustrated in FIG. 1 may be fabricated using any of several methods. Non-limiting examples include lamination methods, layer transfer methods and separation by implantation of oxygen (SIMOX) methods.

Figure 2:
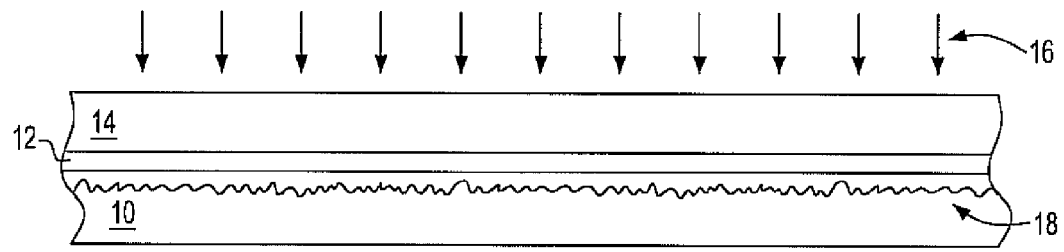

FIG. 2 shows the results of implanting a dose of multiple order radio frequency harmonic suppressing ions 16 into the base semiconductor substrate 10 within the semiconductor-on-insulator substrate whose schematic cross sectional diagram is illustrated in FIG. 1, to provide a multiple order radio frequency harmonic suppressing region 18 that is located and formed as a planar region (i.e., layer) located and formed at a predetermined depth within the base semiconductor substrate 10. Within this particular embodiment, the multiple order radio frequency harmonic suppressing region 18 is typically located and formed at a depth up to 2000 nanometers beneath the interface of the buried dielectric layer 12 and base semiconductor substrate 10, and alternatively from 100 to 2000 nanometers beneath the interface of the buried dielectric layer 12 and the base semiconductor substrate 10, and additionally alternatively from 1000 to 2000 nanometers beneath the interface of the buried dielectric layer 12 and the base semiconductor substrate 10. Thus, the latter conditions provide a multiple order radio frequency harmonic suppressing region 18 that is discernibly separate from the buried dielectric layer 12.

The dose of multiple order radio frequency harmonic suppressing ions 16 may comprise any of several ions which when implanted into the base semiconductor substrate 10 of a particular semiconductor material composition provides the multiple order radio frequency harmonic suppressing region 18 that functionally suppresses (i.e., at least 30 dB, and more preferably at least 40 dB) a transmitted power at a multiple order of a base fundamental radio frequency (i.e., 1fo) within a radio frequency circuit that uses the semiconductor-on-insulator substrate whose schematic cross-sectional diagram is illustrated in FIG. 2.

Desirable are multiple order radio frequency harmonic suppressing ions selected from the group consisting of argon and neon. Other plausible multiple order radio frequency harmonic suppressing ions include, but are not limited to helium, carbon, nitrogen, krypton and xenon ions. Determination of alternative multiple order radio frequency harmonic suppressing ions is not deemed to require undue experimentation. Typically the dose of multiple order radio frequency harmonic suppressing ions 16 is provided at a dose from 5.0E12 to 5.0E15 multiple order radio frequency harmonic suppressing ions per square centimeter and an energy from 30 to 1200 keV to provide a concentration of multiple order radio frequency harmonic suppressing atoms within the multiple order radio frequency harmonic suppressing region 18 within the base semiconductor substrate 10 from 1E17 to 1E21 atoms per cubic centimeter. The multiple order radio frequency harmonic suppressing region 18 typically comprises a dielectric composition that may have a dielectric constant greater than 3, more preferably have a dielectric constant greater than 10, and more still more preferably have a dielectric constant from 10 (or alternatively 20) to 100, to provide inhibited carrier mobility and suppressed multiple order radio frequency harmonics within at least a portion of the base semiconductor substrate 10.

The foregoing analysis is not intended to limit the invention, and alternative explanations and understandings with respect to multiple order radio frequency harmonic suppression are not excluded within the context of this particular embodiment, other embodiments, or the invention in general.

Figure 3:
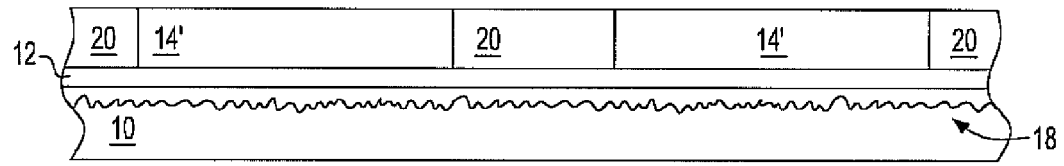

FIG. 3 first shows the results of patterning the surface semiconductor layer 14 to form a plurality of surface semiconductor layers 14' that expose the buried dielectric layer 12. The surface semiconductor layer 14 may be patterned to form the surface semiconductor layers 14' while using methods and materials that are otherwise generally conventional in the semiconductor fabrication art. Such methods and materials will typically include, but are not necessarily limited to, resist masking methods and materials, or hard masking methods and materials, either of which is followed by an etch method, such as but not limited to a wet chemical etch method or a dry plasma etch method. Dry plasma etch methods are often preferred in combination with hard mask methods and materials, insofar as dry plasma etch methods and materials, in comparison with wet chemical etch methods and materials, provide particularly straight sidewalls to the surface semiconductor layers 14'.

Although not particularly specifically illustrated within the schematic cross-sectional diagram of FIG. 3, this particular embodiment contemplates that one of the surface semiconductor layers 14' is doped appropriately to form an nFET while the other of the surface semiconductor layers 14' is doped appropriately to form a pFET. However, the multiple order radio frequency harmonic suppressing effect of the embodiment and the invention may be realized within the context of any of several types of radio frequency devices (i.e., including but not limited to both active devices and passive devices) and radio frequency circuits, and not simply radio frequency FET (i.e., active) devices and circuits that include radio frequency FET devices For example, additional radio frequency active devices may include, but are not necessarily limited to bipolar transistors, as well as complementary metal oxide semiconductor transistors. In addition, also included, but also not limiting, within the embodiment and the invention, are radio frequency circuits that include passive devices, such as but not limited to resistors, capacitors and inductors, as well as combinations thereof, such as but not limited to capacitor and inductor combinations thereof.

FIG. 3 also shows a plurality of isolation regions 20 located and formed into a plurality of apertures that is created by patterning the surface semiconductor layer 14 to form the surface semiconductor layers 14'.

The isolation regions 20 may comprise any of several dielectric isolation materials that are generally conventional in the semiconductor fabrication art. Included in particular with respect to such dielectric materials, but also not limiting with respect to such dielectric materials, are oxides, nitrides and oxynitrides of silicon, as well as oxides, nitrides and oxynitrides of other elements. Other dielectric materials, such as but not limited to carbon alloys and carbides, are also not excluded for forming the isolation regions 20. The dielectric isolation materials may be formed using any of several methods that are conventional in the semiconductor fabrication art. Included in particular, but also not limiting, are chemical vapor deposition methods and physical vapor deposition methods. Typically the isolation regions 20 comprise at least in-part a silicon oxide dielectric material, formed and planarized to the level of the surface semiconductor layers 14'. Such planarizing may be effected using methods including but not limited to mechanical planarizing methods and chemical mechanical polish planarizing methods. Chemical mechanical polish planarizing methods are typically preferred.

Figure 4:
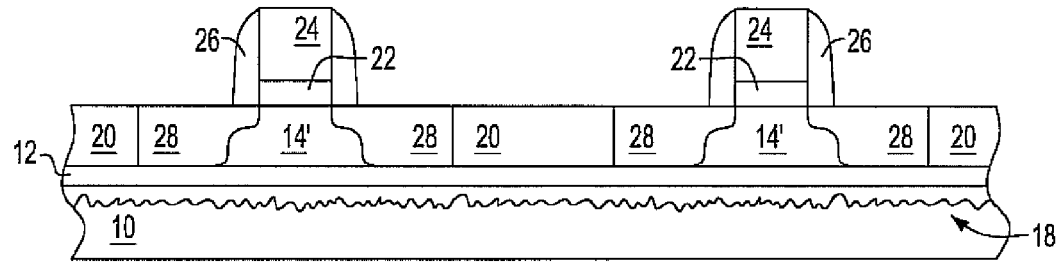

FIG. 4 shows a plurality of field effect transistor devices located and formed within and upon the separate surface semiconductor layers 14' of the semiconductor-on-insulator substrate that is illustrated in FIG. 3, although, as noted above neither this particular embodiment, nor the invention in general, is necessarily limited to a semiconductor-on-insulator substrate that includes a field effect transistor device, or a semiconductor circuit that includes a field effect transistor device.

The field effect transistor devices comprises: (1) a plurality gate dielectrics 22 located and formed upon the surface semiconductor layers 14'; (2) a plurality of gates 24 located and formed upon the plurality of gate dielectrics 22; (3) a plurality of spacers 26 located and formed adjacent and adjoining opposite sidewalls of the gate dielectrics 22 and the gates 24; and (4) a plurality of source and drain regions 28 located and formed within the surface semiconductor layers 14' at locations not covered by the plurality of gates 24. As is understood by a person skilled in the art, each of the plurality of source and drain regions 28 is separated by a channel region that is aligned beneath each gate 24. Each of the foregoing layers and structures included within the forgoing field effect transistor devices may comprise materials and have dimensions that are conventional in the semiconductor fabrication art. Each of the foregoing layers and structures that comprise the field effect transistor devices may also be formed using methods that are conventional in the semiconductor fabrication art.

The gate dielectrics 22 may comprise conventional dielectric materials such as oxides, nitrides and oxynitrides of silicon that have a dielectric constant from about 4 to about 20, measured in vacuum. Alternatively, the gate dielectrics 22 may comprise generally higher dielectric constant dielectric materials having a dielectric constant from about 20 to at least about 100. Such higher dielectric constant dielectric materials may include, but are not limited to hafnium oxides, hafnium silicates, titanium oxides, barium-strontium-titanates (BSTs) and lead-zirconate-titanates (PZTs). The gate dielectrics 22 may be formed using any of several methods that are appropriate to the material of composition of the gate dielectrics. Included, but not limiting are thermal or plasma oxidation or nitridation methods, chemical vapor deposition methods and physical vapor deposition methods. Typically, the gate dielectrics 22 comprise a thermal silicon oxide dielectric material that has a thickness from 1 to 15 nanometers.

The gates 24 may comprise materials including, but not limited to certain metals, metal alloys, metal nitrides and metal silicides, as well as laminates thereof and composites thereof. The gates 24 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gates 24 comprise a doped polysilicon material that has a thickness from 100 to 250 nanometers.

The spacers 26 may comprise materials including, but not limited to conductor materials and dielectric materials. Conductor spacer materials are less common, but are nonetheless known. Dielectric spacer materials are more common. The spacer materials may be formed using methods analogous, equivalent or identical to the methods that are used for forming the buried dielectric layer 12. The spacers 26 are also formed with the distinctive inward pointing spacer shape by using a blanket layer deposition and anisotropic etchback method. Typically, the spacers 26 comprise a silicon oxide dielectric material.

Finally, the plurality of source and drain regions 28 comprises a generally conventional dopant of polarity appropriate to either an nFET or a pFET. As is understood by a person skilled in the art, the plurality of source and drain regions 28 is formed using a two-step ion implantation method. A first ion implantation process step within the method uses the gates 24, absent the spacers 26 as a mask, to form a plurality of extension regions each of which extends beneath a particular spacer 26. A second ion implantation process step uses the gates 24 and the spacers 26 as a mask, to form the larger contact region portions of the plurality of source and drain regions 28, while simultaneously incorporating the pair of extension regions. Dopant levels are from about 1e19 to about 1e21 dopant atoms per cubic centimeter within each of the plurality of source and drain regions 28. Extension regions within the plurality of source and drain regions 28 may under certain circumstances be more lightly doped than contact regions with the plurality of source and drain regions 28, although such differential doping concentrations are not a requirement of the embodiment or the invention.

FIG. 4 shows a schematic cross-sectional diagram of a complementary metal oxide semiconductor-on-insulator structure in accordance with a particular embodiment of the invention that comprises a first particular embodiment of the invention. The complementary metal oxide semiconductor-on-insulator structure whose schematic cross-sectional diagram is illustrated in FIG. 4 provides for a radio frequency integrated circuit with attenuated and suppressed multiple order radio frequency harmonics within the context of a primary radio frequency for radio frequency power transmission from the radio frequency complementary metal oxide semiconductor-on-insulator structure whose schematic cross-sectional diagram is illustrated in FIG. 4. The particular first embodiment whose schematic cross-sectional diagram is illustrated in FIG. 4 realizes the forgoing result by incorporating within a base semiconductor substrate 10 within the radio frequency complementary metal oxide semiconductor-on-insulator structure a multiple order radio frequency harmonic suppressing region 18 as a planar region within the base semiconductor substrate 10 at a location at or beneath an interface of the buried dielectric layer 12 with the base semiconductor substrate 10.

Figure 5:
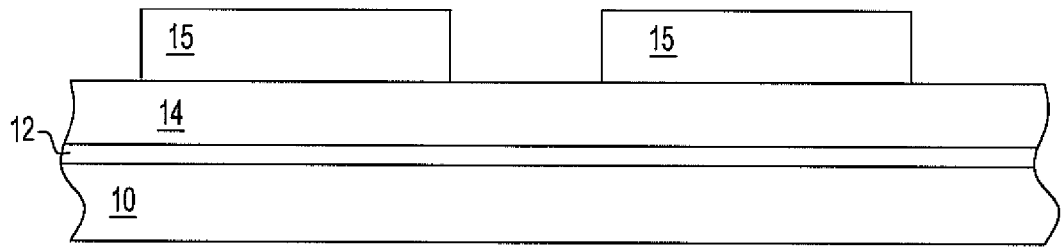
FIG. 5 to FIG. 8 show a series of schematic cross-sectional diagrams illustrating the results of progressive semiconductor-on-insulator substrate fabrication (FIG. 5), multiple order radio frequency harmonic suppressing region formation (FIG. 6), isolation region formation (FIG. 7) and field effect device fabrication (FIG. 8) process steps in fabricating a radio frequency complementary metal oxide semiconductor-on-insulator structure in accordance with another particular embodiment of the invention.

FIG. 5 to FIG. 8 show a series of schematic cross-sectional diagrams illustrating the results of progressive stages in fabricating a complementary metal oxide semiconductor-on-insulator structure in accordance with another embodiment of the invention. This other embodiment of the invention comprises a second embodiment of the invention. FIG. 5 shows a schematic cross-sectional diagram of the complementary metal oxide semiconductor-on-insulator structure at an early stage in the fabrication thereof in accordance with this additional second embodiment of the invention.

FIG. 5 corresponds with FIG. 1, but with the addition of a plurality of masks 15 located and formed upon the surface semiconductor layer 14.

The plurality of masks 15 may comprise any of several mask materials. Included in particular, but also not limiting, are hard mask materials and photoresist mask materials. As is discussed above, hard mask materials are generally preferred insofar as hard mask materials assist in providing generally straighter sidewalls when forming patterned layers from blanket layers within semiconductor structures.

Figure 6:
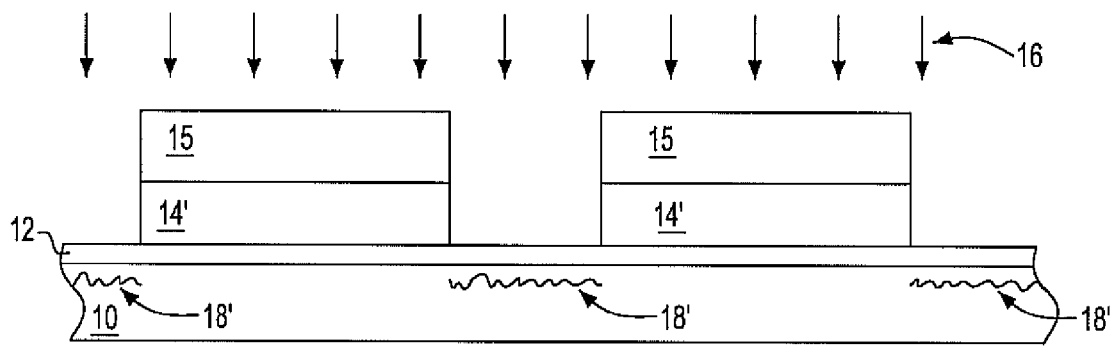

FIG. 6 first shows the results of patterning the surface semiconductor layer 14 to form the surface semiconductor layers 14'. The surface semiconductor layer 14 may be patterned to form the surface semiconductor layers 14' while using methods and materials analogous, equivalent or identical to the methods and materials that are used for forming the surface semiconductor layers 14' that are illustrated in FIG. 3 from the surface semiconductor layer 14 that is illustrated in FIG. 2.

FIG. 6 also shows the same dose of multiple order radio frequency harmonic suppressing ions 16 that is illustrated within the schematic cross-sectional diagram of FIG. 2, but now used to form a plurality of multiple order radio frequency harmonic suppressing regions 18' that are formed and located as discrete regions 18' within the base semiconductor substrate 10 at locations not covered by the masks 15 or the surface semiconductor layers 14'. The multiple order radio frequency harmonic suppressing regions 18' may be formed using methods and materials analogous, equivalent or identical to the multiple order radio frequency harmonic suppressing region 18 that is illustrated in FIG. 2, but now formed discretely within the base semiconductor substrate 10 at locations not covered by the masks 15 or the surface semiconductor layers 14'. Thus, although the dosage of multiple order radio frequency harmonic suppressing ions 16 is provided at the same dose within FIG. 2 and FIG. 6, an ion implantation energy will typically be decreased within the second embodiment as illustrated in FIG. 6, and typically from 30 to 200 keV.

Figure 7:
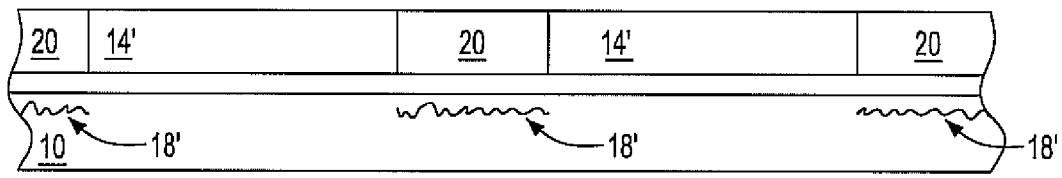

FIG. 7 first shows the results of stripping the masks 15 from the complementary metal oxide semiconductor-on-insulator structure whose schematic cross-sectional diagram is illustrated in FIG. 6. The masks 15 may be stripped using methods and materials that are otherwise generally conventional in the semiconductor fabrication art, and appropriate to the material from which is comprised the masks 15. Included more particularly, but also generally not limiting, are wet chemical etch methods and materials, and dry plasma etch methods and materials.

FIG. 7 also shows the results of forming the plurality of isolation regions 20 within a plurality of apertures that separate the surface semiconductor layers 14'. The isolation regions 20 are formed using methods and materials analogous, equivalent or identical to the methods and materials that are used for forming the isolation regions 20 that are illustrated in FIG. 3.

Figure 8:
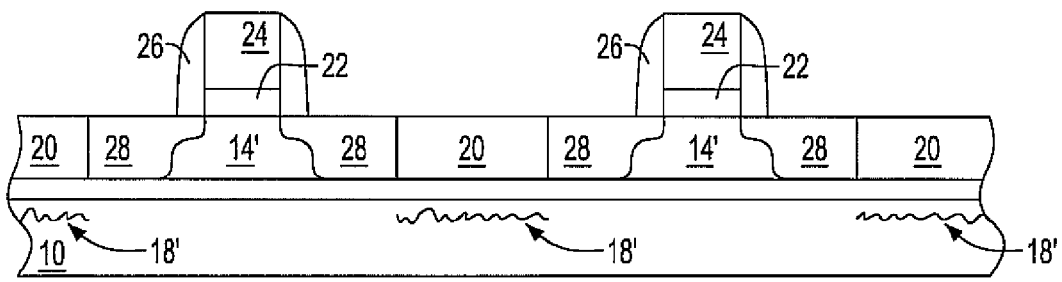

FIG. 8 shows the results of forming the nFET and the pFET within and upon separated surface semiconductor layers 14' that are illustrated in FIG. 7. Thus, FIG. 8 shows a radio frequency complementary metal oxide semiconductor-on-insulator structure analogous to the radio frequency complementary metal oxide semiconductor-on-insulator structure whose schematic cross-sectional diagram is illustrated in FIG. 4, but wherein while the radio frequency complementary metal oxide semiconductor-on-insulator structure of FIG. 8 uses discrete and discontinuous multiple order radio frequency harmonic suppressing regions 18', the radio frequency complementary metal oxide semiconductor-on-insulator structure of FIG. 4 uses only a single multiple order radio frequency harmonic suppressing region 18.

The radio frequency complementary metal oxide semiconductor-on-insulator structure of FIG. 8 otherwise generally provides the advantages of the radio frequency complementary metal oxide semiconductor-on-insulator structure of FIG. 4.

In order to illustrate the value of the invention, otherwise identical radio frequency complementary metal oxide semiconductor-on-insulator structures were fabricated: (1) absent any multiple order radio frequency harmonic suppressing region; or alternatively; (2) with a multiple order radio frequency harmonic suppressing region 18 in accordance with the first embodiment as illustrated in FIG. 4; or (3) with a plurality of multiple order radio frequency harmonic suppressing regions 18' in accordance with the second embodiment as illustrated in FIG. 8, where the multiple order radio frequency harmonic suppressing regions 18' included an incomplete area coverage of a base semiconductor substrate 10.

Within these particular examples, a multiple order radio frequency harmonic suppressing region 18 in accordance with the first embodiment was fabricated by first implanting a dose of argon multiple order radio frequency harmonic suppressing ions beneath an interface of a buried dielectric layer with a base semiconductor substrate within a semiconductor-on-insulator substrate. The argon ion implantation was undertaken at an ion implantation energy of 1200 keV and an ion implantation dose of 1E14 argon ions per square centimeter, along with a semiconductor-on-insulator substrate work piece tilt angle of zero degrees and a semiconductor-on-insulator substrate work piece twist angle of zero degrees.

In general, a tilt angle of any type of semiconductor substrate work piece is defined as an angle of an incoming ion implantation beam relative to a normal to the semiconductor substrate work piece surface. Similarly a twist angle of any type of semiconductor substrate work piece is defined as the angle between the projection of an ion implantation beam on the semiconductor substrate work piece surface, and an arbitrarily selected crystallographic orientation of the semiconductor substrate work piece. Often, the arbitrarily selected crystallographic orientation of the semiconductor substrate work piece is a [011] crystallographic orientation, which within the context of semiconductor structure fabrication and semiconductor device fabrication corresponds with a notch within an edge of a semiconductor substrate, which may include, but is not necessarily limited to, a semiconductor-on-insulator substrate.

Within the context of the second embodiment, the foregoing examples also included the formation of multiple order radio frequency harmonic suppressing regions 18' discontinuously within a semiconductor-on-insulator substrate by ion implantation into the exposed bottoms of a plurality of isolation trenches that separated adjacent surface semiconductor layer islands within the semiconductor-on-insulator substrate. Within the context of these examples, the isolation trenches had a linewidth of 80 nanometers. In addition, these examples also used an argon multiple order radio frequency harmonic suppressing ion implant performed using three sequential, successive and consecutive argon ion beams. Each of the three argon ion beams included four orientations, each having a tilt of 2 degrees, where the four orientations included successive twists of 0, 90, 180 & 270 degrees. The first argon ion beam was provided at an ion implantation energy of 500 keV and an ion implantation dose of 2E14 argon multiple order radio frequency harmonic suppressing ions per square centimeter. The second argon ion beam was provided at an ion implantation energy of 100 keV and an ion implantation dose of 1E16 argon multiple order radio frequency harmonic suppressing ions per square centimeter. The third argon ion beam was provided at an ion implantation energy of 30 keV and an ion implantation dose of 5E15 argon multiple order radio frequency harmonic suppressing ions per square centimeter.

The radio frequency complementary metal oxide semiconductor-on-insulator structures also included resistors and capacitors that were designed and arranged to provide a generally conventional radio frequency circuit operating at 900 MHz and at 35 dBM power to provide a radio frequency transmit/receive switch circuit that is generally intended for use within wireless communications systems.

The efficacy of the first and second embodiments has have been proven in the design of radio frequency switch circuits. The design and processing of radio frequency switch circuits is well known in the art. The multiple order radio frequency harmonic suppressing regions 18/18' as designed above were applied to the design of the switch circuit in order to improve the harmonic suppression. The maximum achievable harmonic suppression was demonstrated on the last metal coplanar waveguide where the harmonic suppression is quantitatively reported below (TABLE I). Determined was a second harmonic (f2o) and third harmonic (f3o) suppression (in comparison with the primary transmitted radio frequency power (f1o) within each of the three radio frequency complementary metal oxide semiconductor-on-insulator structures. The resultant harmonic suppression expected from the switch circuit design is comparable but not necessarily as effective (see TABLE I).

TABLE I

| Circuit | IL at f1o (dB) | Supp at f2o (dBc) | Supp at f3o (dBc) |
|---|---|---|---|
| Transmission Lines: | | | |
| No Suppressing Region | 1.61 | −55.2 | −56.2 |
| First Embodiment | 1.29 | −56.3 | −59.5 |
| Second Embodiment | 0.80 | −63.3 | −71.0 |
| Switch: | | | |
| Second Embodiment | 1.26 | −66.4 | −56.4 |

As is seen from the data of Table I, either the first embodiment of the invention or the second embodiment of the invention, by virtue of incorporation of a continuous or a discontinuous multiple order radio frequency harmonic suppressing region 18/18' within a radio frequency complementary metal oxide semiconductor-on-insulator structure provides the radio frequency complementary metal oxide semiconductor-on-insulator structure with reduced insertion loss and suppressed multiple order radio frequency harmonic power transmission in comparison with a fundamental radio frequency power transmission at a fundamental radio frequency, further within the context of a radio frequency transmit/receive switch circuit.

The preferred embodiments are illustrative of the invention rather than limiting of the invention. Revisions and modifications may be made to methods, materials, structures and dimension of a radio frequency complementary metal oxide semiconductor-on-insulator structure in accordance with the first embodiment or the second embodiment, while still providing a semiconductor-on-insulator substrate or a semiconductor-on-insulator structure, or a method for fabrication thereof in accordance with the invention, further in accordance with the accompanying claims.

What is claimed is:

1. A semiconductor-on-insulator substrate comprising:
a base semiconductor substrate;
a buried dielectric layer located upon the base semiconductor substrate; and
a surface semiconductor layer located upon the buried dielectric layer, said surface semiconductor layer including a radio frequency circuit device operable at radio frequencies,
wherein the base semiconductor substrate includes at or beneath an interface of the buried dielectric layer and the base substrate, at least one multiple order radio frequency harmonic suppressing region comprising ions of a noble gas element for reducing a coupling of radio frequency signals at multiple harmonics relative to a base fundamental radio frequency from said radio frequency circuit device into said base substrate.

2. The semiconductor-on-insulator substrate of claim 1, wherein the base semiconductor substrate comprises a silicon semiconductor material.

3. The semiconductor-on-insulator substrate of claim 1, wherein the multiple order radio frequency harmonic suppressing region comprises a single planar region located within the base semiconductor substrate at a distance up to 2000 nanometers beneath the interface of the buried dielectric layer and the base semiconductor substrate.

4. The semiconductor-on-insulator substrate of claim 1, wherein the multiple order radio frequency harmonic suppressing region comprises a plurality of co-planar regions located within the base semiconductor substrate at a distance up to 2000 nanometers beneath the interface of the buried dielectric layer and the base semiconductor substrate.

5. The semiconductor-on-insulator substrate of claim 1, wherein the multiple order radio frequency harmonic suppressing region comprises ions of at least one dopant selected from the group consisting of carbon, nitrogen, neon, argon, krypton and xenon dopants.

6. The semiconductor-on-insulator substrate of claim 1, wherein the multiple order radio frequency harmonic suppressing region comprises a dielectric material having a dielectric constant from 10 to 100.

7. The semiconductor-on-insulator substrate of claim 1, wherein said included radio frequency circuit device is located within the surface semiconductor layer to thus provide a radio frequency semiconductor-on-insulator structure.

8. The semiconductor-on-insulator structure of claim 7 wherein the radio frequency device comprises a complementary metal oxide semiconductor device.

9. The semiconductor-on-insulator structure of claim 7 wherein the radio frequency device comprises a passive device.

10. The semiconductor-on-insulator structure of claim 7, wherein the multiple order radio frequency harmonic suppressing region functionally suppresses a transmitted power signal at a multiple order radio frequency relative to of a base fundamental radio frequency by at least 40 dB.

* * * * *